(12) United States Patent
Matsubara

(10) Patent No.: US 8,189,248 B2
(45) Date of Patent: May 29, 2012

(54) COMPUTER GENERATED HOLOGRAM, EXPOSURE APPARATUS AND DEVICE FABRICATION METHOD

(75) Inventor: Isao Matsubara, Tucson, AZ (US)

(73) Assignee: Canon Kabushiki Kaisha, Tokyo (JP)

( * ) Notice: Subject to any disclaimer, the term of this patent is extended or adjusted under 35 U.S.C. 154(b) by 457 days.

(21) Appl. No.: 12/481,428

(22) Filed: Jun. 9, 2009

(65) Prior Publication Data

US 2010/0183956 A1   Jul. 22, 2010

(30) Foreign Application Priority Data

Jun. 10, 2008 (JP) ................. 2008-152259

(51) Int. Cl.
*G03H 1/02* (2006.01)
*G03H 1/08* (2006.01)
*G03H 1/04* (2006.01)
(52) U.S. Cl. ..................... 359/3; 359/9; 430/1
(58) Field of Classification Search .......... None
See application file for complete search history.

(56) References Cited

U.S. PATENT DOCUMENTS

| 7,265,816 B2 | 9/2007 | Tsuji |
| 2006/0028957 A1 | 2/2006 | Kim |
| 2009/0034036 A1* | 2/2009 | Matsubara ........... 359/9 |
| 2010/0208315 A1* | 8/2010 | Matsubara ........... 359/9 |
| 2011/0116069 A1* | 5/2011 | Matsubara ........... 355/71 |

FOREIGN PATENT DOCUMENTS

| JP | 2006-005319 A | 1/2006 |
| JP | 2006-049902 A | 2/2006 |
| JP | 2006-196715 A | 7/2006 |

OTHER PUBLICATIONS

Yu, et al. "Polarization-multiplexed diffractive optical elements fabricated by subwavelength structures", 2002 Applied Optics, vol. 41 No. 1, pp. 96-100, XP007906815.

* cited by examiner

*Primary Examiner* — Jade R Chwasz
(74) *Attorney, Agent, or Firm* — Canon USA, Inc. IP Division

(57) ABSTRACT

A computer generated hologram includes a plurality of cells which form a light intensity distribution on a predetermined plane. The plurality of cells includes a plurality of first cells including isotropic media and anisotropic media, and a plurality of second cells including anisotropic media alone. The plurality of cells change a phase of incident light which impinges on each of the plurality of cells to form a phase distribution including N phases (N is the number of phases, $N \geq 2$) for each of a wavefront of a linearly polarized light component in a first direction and a wavefront of a linearly polarized light component in a second direction perpendicular to the first direction.

10 Claims, 7 Drawing Sheets

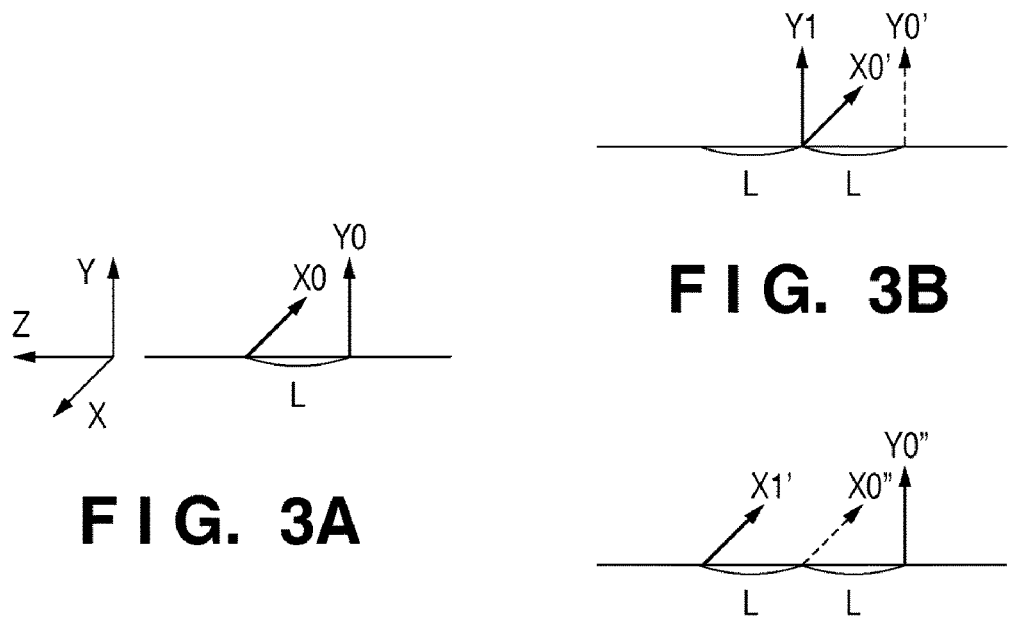
FIG. 3A
FIG. 3B
FIG. 3C
FIG. 4
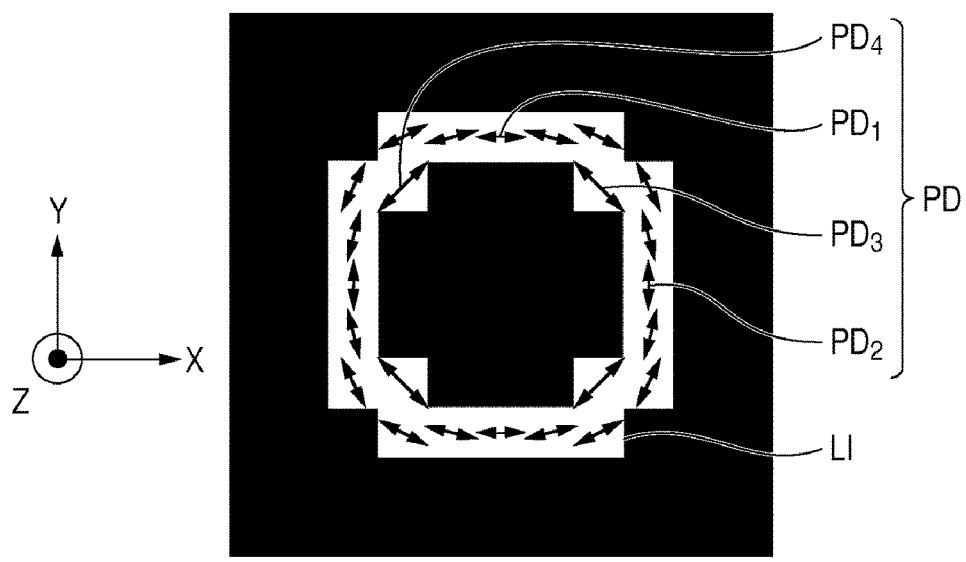

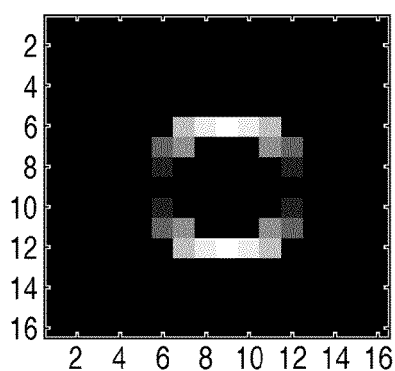
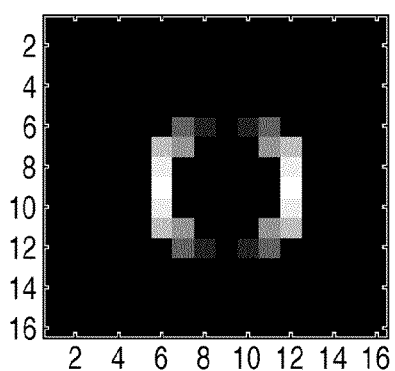
FIG. 5A  FIG. 5B
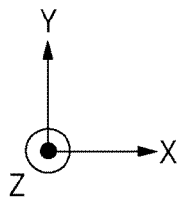
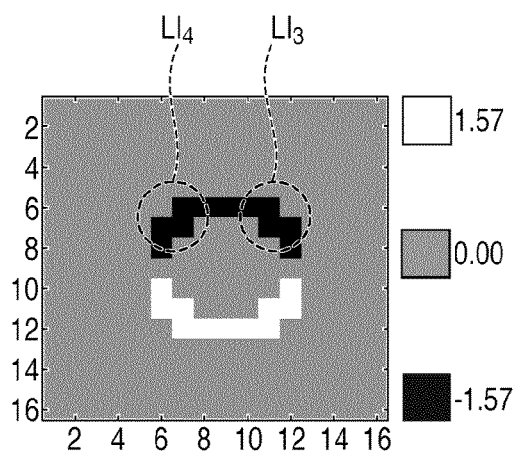
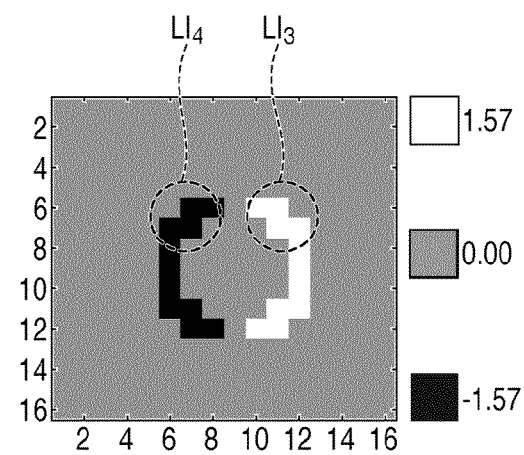
FIG. 6A  FIG. 6B
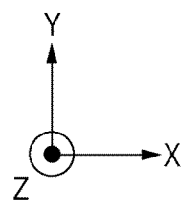

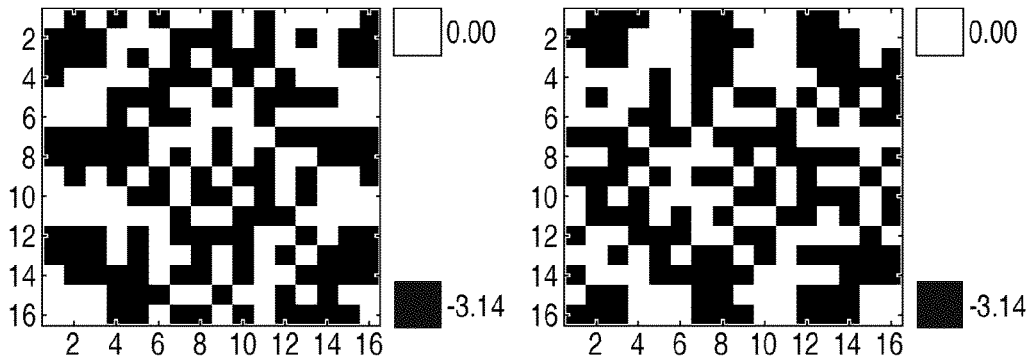
F I G. 7A   F I G. 7B
F I G. 8
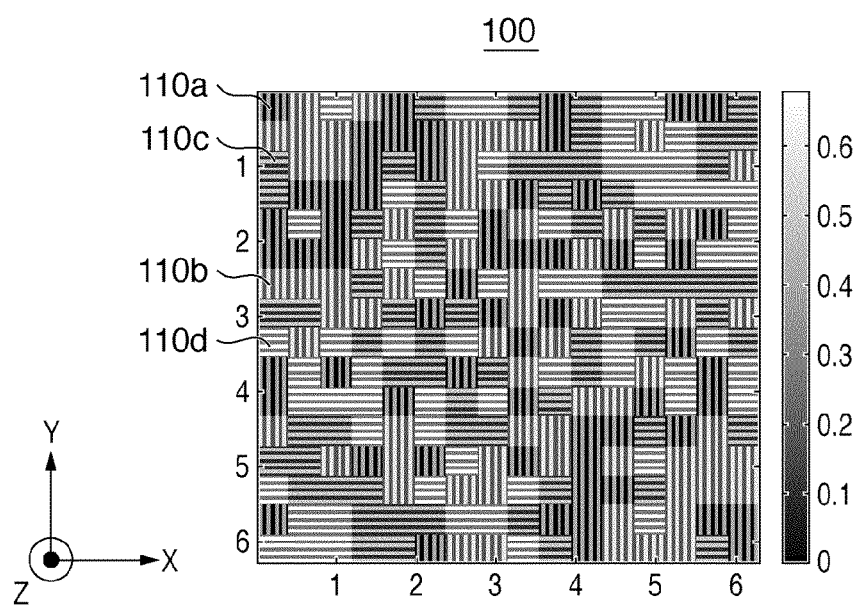

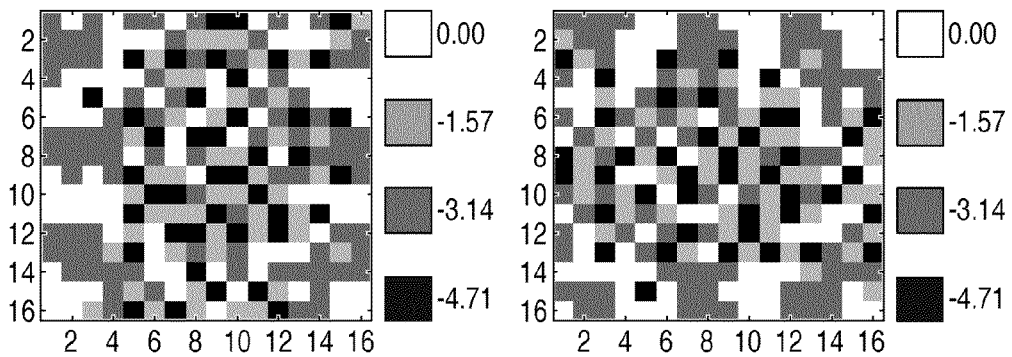
F I G. 9A   F I G. 9B
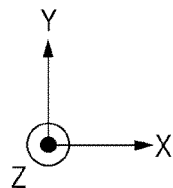
F I G. 10
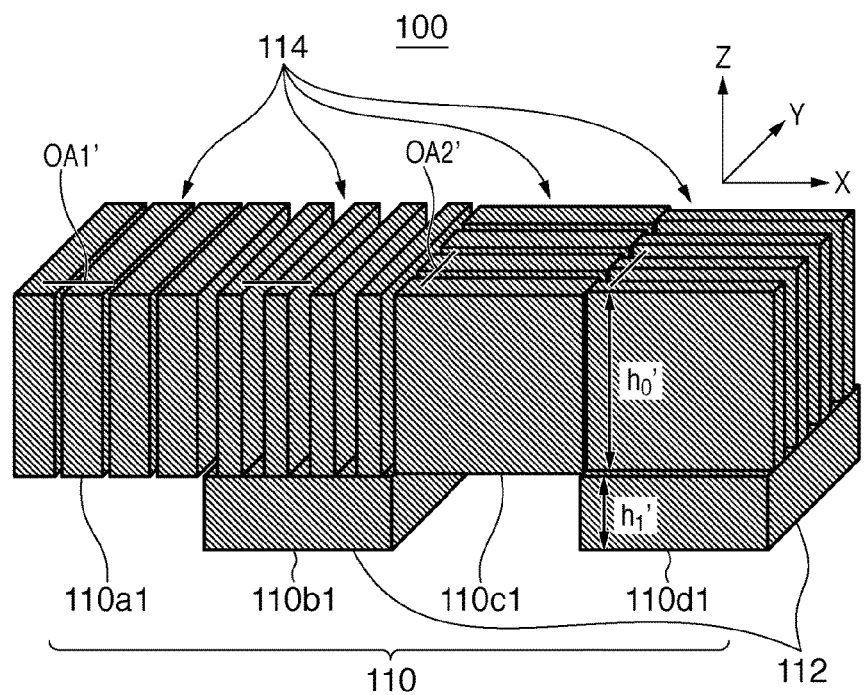

FIG. 11

| (0, 0)<br>VERTICAL: 0.93<br>0 | (0, -π/2)<br>VERTICAL: 0.50<br>0 | (0, -π)<br>HORIZONTAL: 0.50<br>5π/4 | (0, -3π/2)<br>HORIZONTAL: 0.93<br>7π/4 |
|---|---|---|---|
| (-π/2, 0)<br>HORIZONTAL: 0.93<br>π/4 | (-π/2, -π/2)<br>VERTICAL: 0.93<br>2π/4 | (-π/2, -π)<br>VERTICAL: 0.50<br>2π/4 | (-π/2, -3π/2)<br>HORIZONTAL: 0.50<br>7π/4 |
| (-π, 0)<br>HORIZONTAL: 0.50<br>π/4 | (-π, -π/2)<br>HORIZONTAL: 0.93<br>3π/4 | (-π, -π)<br>VERTICAL: 0.93<br>4π/4 | (-π, -3π/2)<br>VERTICAL: 0.50<br>4π/4 |
| (-3π/2, 0)<br>VERTICAL: 0.50<br>6π/4 | (-3π/2, -π/2)<br>HORIZONTAL: 0.50<br>3π/4 | (-3π/2, -π)<br>HORIZONTAL: 0.93<br>5π/4 | (-3π/2, -3π/2)<br>VERTICAL: 0.93<br>6π/4 |

FIG. 12

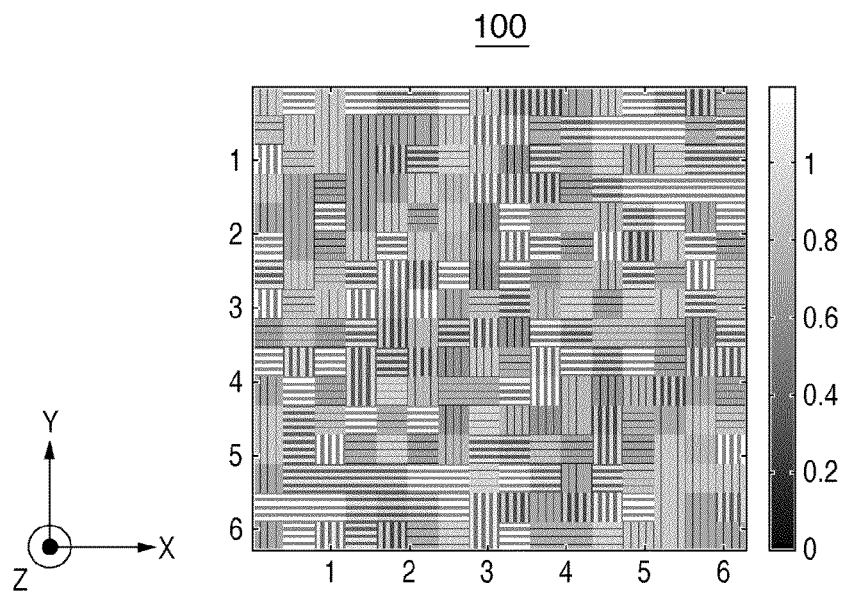

COMPUTER GENERATED HOLOGRAM, EXPOSURE APPARATUS AND DEVICE FABRICATION METHOD

BACKGROUND OF THE INVENTION

1. Field of the Invention

The present invention relates to a computer generated hologram, an exposure apparatus and a device fabrication method.

2. Description of the Related Art

A projection exposure apparatus has conventionally been employed to fabricate a micropatterned semiconductor device such as a semiconductor memory or logic circuit by using photolithography. The projection exposure apparatus projects and transfers a circuit pattern formed on a reticle (mask) onto a substrate such as a wafer via a projection optical system.

The resolution R of the projection exposure apparatus is given by:

$$R = k_1 \times \frac{\lambda}{NA} \quad (1)$$

where $\lambda$ is the exposure light wavelength, NA is the numerical aperture of the projection optical system, and $k_1$ is a process constant determined by, e.g., a development process.

The shorter the exposure light wavelength or the higher the NA of the projection optical system, the better the resolution. However, it is difficult to further shorten the current exposure light wavelength because the transmittance of a general glass material decreases as the exposure light wavelength shortens. It is also difficult to further increase the NA of the projection optical system available at present because the depth of focus decreases in inverse proportion to the second power of the NA of the projection optical system, and because it is hard to design and manufacture lenses to form a high-NA projection optical system.

Under the circumstances, there have been proposed resolution enhanced technologies (RETS) of improving the resolution by decreasing the process constant $k_1$. One of these RETS is the so-called modified illumination method (or oblique illumination method).

The modified illumination method generally inserts an aperture stop, which has a light-shielding plate on the optical axis of an optical system, in the vicinity of the exit surface of an optical integrator which forms a uniform surface light source, thereby obliquely irradiating a reticle with exposure light. The modified illumination method includes, for example, an annular illumination method and quadrupole illumination method that are different in the aperture shape of an aperture stop (i.e., the shape of the light intensity distribution). There has also been proposed another modified illumination method which uses a computer generated hologram (CGH) in place of an aperture stop, in order to improve the use efficiency (illumination efficiency) of the exposure light.

Along with an increase in the NA of the projection optical system, a polarized illumination method which controls the polarization state of exposure light is also becoming necessary to increase the resolution of the projection exposure apparatus. The polarized illumination method basically illuminates a reticle with not P-polarized light but S-polarized light alone, which has a component in the circumferential direction of concentric circles about the optical axis.

In recent years, there has been proposed a technique which exploits both the modified illumination method (the formation of a light intensity distribution having a desired shape (for example, a quadrupolar shape)) and the polarized illumination method (polarization state control).

For example, Japanese Patent Laid-Open No. 2006-196715 discloses a technique which implements both the modified illumination method and polarized illumination method using one element. Japanese Patent Laid-Open No. 2006-196715 controls the shape (reproduced image) of the light intensity distribution using a CGH, and controls the polarization state using form birefringence. More specifically, this technique forms one CGH by parallelly arranging a plurality of CGHs (to be referred to as "sub-CGHs" hereinafter) corresponding to light beams in the same polarization direction, and applies form birefringence corresponding to the polarization direction to each sub-CGH.

Japanese Patent Laid-Open No. 2006-49902 selectively uses a desired polarization mode by adopting a polarization controller as a unit for controlling polarization modes applied to a sub-CGH.

Japanese Patent Laid-Open No. 2006-5319 discloses a technique which can control the balance among four poles of a quadrupolar light intensity distribution typically formed by the modified illumination method and polarized illumination method. More specifically, Japanese Patent Laid-Open No. 2006-5319 forms sub-CGHs by dividing a CGH into four, and changes the intensity distribution of the incident light, thereby making it possible to change the pole balance of the reproduced image obtained by the CGH.

However, the prior arts form sub-CGHs by dividing one CGH into a plurality of CGHs, so an illuminance variation occurs in the reproduced image if the optical integrator cannot sufficiently correct the intensity distribution of the incident light (for example, if the light impinges on only some of these CGHs).

When a plurality of sub-CGHs are combined, unnecessary diffracted light is generated due to structural discontinuity that occurs at the boundary between the sub-CGHs, resulting in deterioration in the reproduced image obtained by the CGH. The structural discontinuity that occurs at the boundary between the sub-CGHs can be eliminated by improving the design of a computer generated hologram, but this poses another problem that the design cost increases enormously.

When the polarization modes are selectively used by the polarization controller, the use efficiency (illumination efficiency) of the light (exposure light) from the exposure light source decreases significantly (i.e., a loss in light amount increases).

A general CGH is designed as an infinitely thin element using Fourier transformation. For this reason, the achievement of thinner elements is a challenge always encountered in designing and manufacturing CGHs. It is also demanded to form a desired phase distribution by a CGH with fewer steps (i.e., while achieving thinner elements) in order to reduce manufacturing errors.

SUMMARY OF THE INVENTION

The present invention provides a computer generated hologram which can suppress an illuminance variation and a loss in light amount and achieve a structure thinner than ever, thus forming a light intensity distribution (reproduced image) with a desired shape and polarization state.

According to one aspect of the present invention, there is provided a computer generated hologram including a plurality of cells which form a light intensity distribution on a predetermined plane, the plurality of cells including a plurality of first cells including isotropic media and anisotropic media, and a plurality of second cells including anisotropic media alone, wherein the plurality of cells change a phase of incident light which impinges on each of the plurality of cells to form a phase distribution including N (N≧2) for each of a wavefront of a linearly polarized light component in a first direction and a wavefront of a linearly polarized light component in a second direction perpendicular to the first direction, each of the anisotropic media of the plurality of first cells and the plurality of second cells includes one of an anisotropic medium having an optic axis in the first direction and an anisotropic medium having an optic axis in the second direction, and letting λ be a wavelength of the incident light, and Δna be a difference between refractive indices, with respect to linearly polarized light components in the first direction and the second direction, of each of the anisotropic media of the plurality of first cells and the plurality of second cells, an anisotropic medium thickest of the anisotropic media of the plurality of first cells and the plurality of second cells has a thickness of $\lambda/\Delta na \times (N-1)/2N$.

Further aspects of the present invention will become apparent from the following description of exemplary embodiments with reference to the attached drawings.

BRIEF DESCRIPTION OF THE DRAWINGS

FIGS. 3A to 3C are conceptual views each showing the relationship between the phases of X-polarized light and Y-polarized light.

FIG. 4 is a view showing an example of an annular light intensity distribution (target image) formed by the computer generated hologram shown in FIG. 1.

FIGS. 5A and 5B are charts showing the intensities of X- and Y-polarized light components when the light intensity distribution shown in FIG. 4 is divided into them in accordance with their intensity ratio.

FIGS. 6A and 6B are charts showing the phases of X- and Y-polarized light components when the light intensity distribution shown in FIG. 4 is divided into them in accordance with their intensity ratio.

FIGS. 7A and 7B are charts showing the phase distributions of computer generated holograms designed to be compatible with the intensities and phases of X- and Y-polarized light components shown in FIGS. 5A and 5B and 6A and 6B, respectively.

FIG. 8 is a chart showing the thickness of each cell of a computer generated hologram obtained by integrating the two computer generated holograms shown in FIGS. 7A and 7B.

FIGS. 9A and 9B are charts showing the phase distributions of computer generated holograms designed to be compatible with the intensities and phases of X- and Y-polarized light components shown in FIGS. 5A and 5B and 6A and 6B, respectively.

FIG. 10 is a schematic perspective view showing cell structures of four of 16 types, which constitute the computer generated hologram shown in FIG. 1.

FIG. 11 is a table showing 16 types of cell constituent elements which constitute a computer generated hologram for forming a phase distribution including four phases.

FIG. 12 is a chart showing the thickness of each cell of a computer generated hologram obtained by integrating the two computer generated holograms shown in FIGS. 9A and 9B in accordance with the cell constituent elements shown in FIG. 11.

DESCRIPTION OF THE EMBODIMENTS

Figure 1:
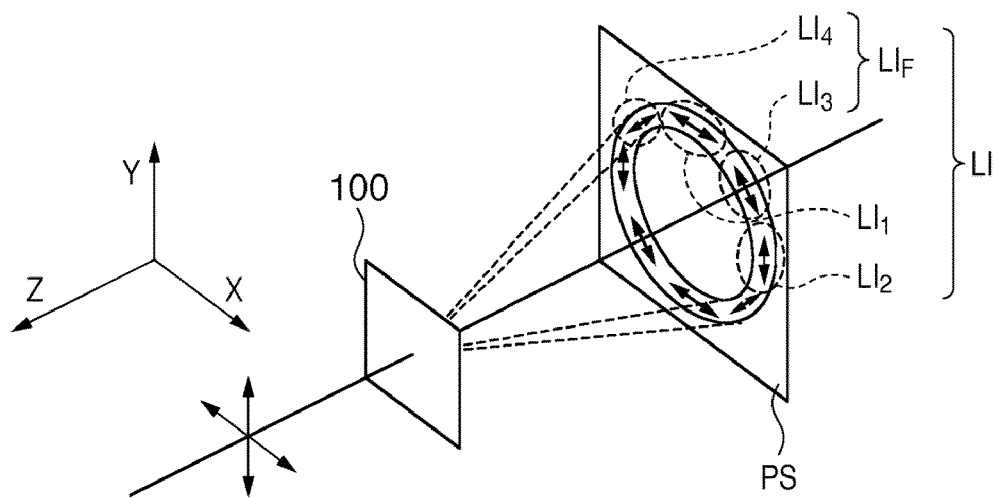
FIG. 1 is a view for explaining a computer generated hologram according to one aspect of the present invention.

Preferred embodiments of the present invention will be described below with reference to the accompanying drawings. Note that the same reference numerals denote the same members throughout the drawings, and a repetitive description thereof will not be given.

FIG. 1 is a view for explaining a computer generated hologram 100 according to one aspect of the present invention. As shown in FIG. 1, the computer generated hologram 100 forms a light intensity distribution (reproduced image) LI on a predetermined plane PS (for example, at the aperture position) by changing the wavefront of the incident light on the computer generated hologram 100. The computer generated hologram 100 also forms a phase distribution including N (N≧2) phases for each of the wavefront of X-polarized light as a linearly polarized light component in a first direction and that of Y-polarized light as a linearly polarized light component in a second direction. This makes it possible to make a first light intensity distribution $LI_1$ formed by X-polarized light (a polarized component in the X-axis direction of the incident light) different from a second light intensity distribution $LI_2$ formed by Y-polarized light (a polarization component in the Y-axis direction of the incident light). Note that X-polarized light as a linearly polarized light component in a first direction is linearly polarized light whose polarization direction is the X-axis direction, and Y-polarized light as a linearly polarized light component in a second direction is linearly polarized light whose polarization direction is the Y-axis direction. Note also that X-polarized light as a linearly polarized light component in a first direction and Y-polarized light as a linearly polarized light component in a second direction are orthogonal to each other.

When the incident light on the computer generated hologram 100 is linearly polarized light including X- and Y-polarized light components, the computer generated hologram 100 forms a light intensity distribution by linearly polarized light, whose polarization direction is different from those of X-polarized light and Y-polarized light, in a region $LI_F$ in which the first light intensity distribution $LI_4$ and the second light intensity distribution $LI_2$ are superposed on each other. More specifically, the computer generated hologram 100 forms a third light intensity distribution $LI_3$ and a fourth light intensity distribution $LI_4$ in regions $LI_F$ in this embodiment.

Figure 2:
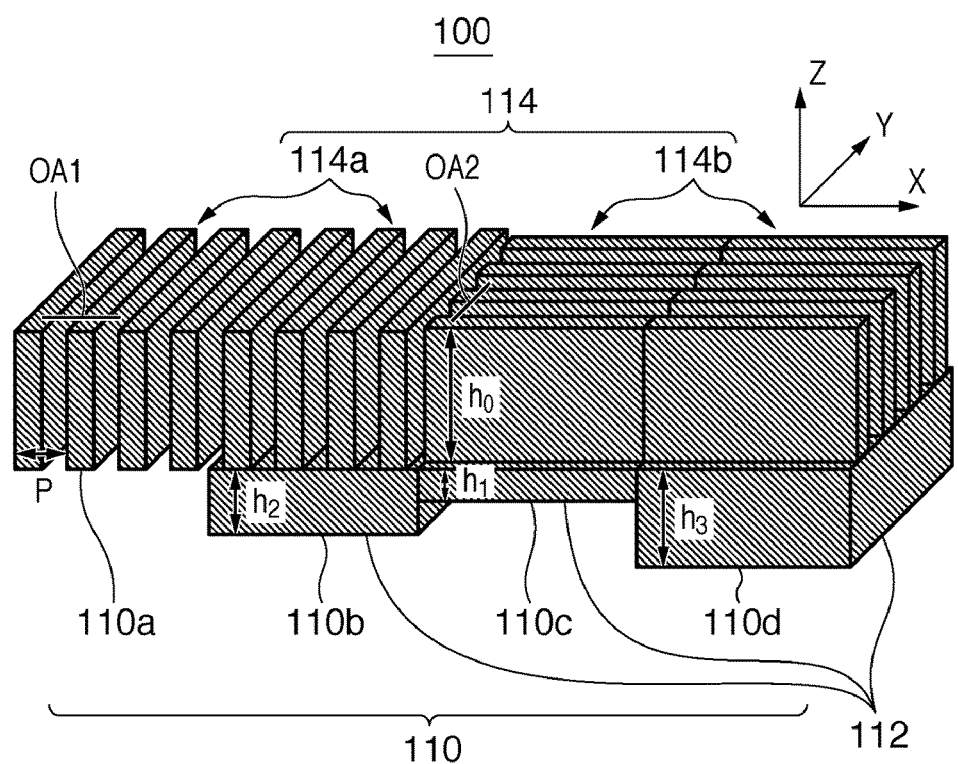
FIG. 2 is a schematic perspective view showing a cell structure which forms the computer generated hologram shown in FIG. 1.

The computer generated hologram 100 will be explained in detail below. FIG. 2 is a schematic perspective view showing cell structures which constitute the computer generated hologram 100.

To form different phase distributions (phase distributions including N phases) for each of the wavefronts of X-polarized light and Y-polarized light by changing the wavefront of the incident light, the computer generated hologram 100 must independently control the wavefronts in the respective polarization directions. When the computer generated hologram 100 is assumed to be that which forms a phase distribution including two phases for each of the wavefronts of X-polarized light and Y-polarized light, it is necessary to give binary phases to each of the wavefronts in the two polarization directions. For this reason, cells 110 of the computer generated hologram 100 must have four types of cell structures (i.e., a plurality of cells). Each of a plurality of cells 110a to 110d shown in FIG. 2 has a cell structure of one of these four types. A computer generated hologram 100 is formed by arraying four types of cells 110 in a tetragonal lattice pattern.

The plurality of cells 110 include isotropic media 112 whose refractive index with respect to X-polarized light is equal to that with respect to Y-polarized light, and anisotropic media 114 whose refractive index with respect to X-polarized light is different from that with respect to Y-polarized light, as shown in FIG. 2. However, a change in the polarization state of the incident light by the isotropic medium 112 need only be smaller than that by the anisotropic medium 114, and this embodiment assumes that a medium in which the difference between its refractive indices with respect to X-polarized light and Y-polarized light is 0 (inclusive) to 0.001 (inclusive) is an isotropic medium.

The anisotropic medium 114 forms a phase difference between the wavefronts of X-polarized light and Y-polarized light, and can be made of an anisotropic material or have, e.g., a periodic structure (having an unevenness shape) which generates form birefringence. In this embodiment, the anisotropic medium 114 has a one-dimensional periodic structure with a period (pitch) P smaller than the wavelength of the incident light in order to prevent the generation of diffracted light beams of orders other than the 0th-order.

The anisotropic media 114 include an anisotropic medium 114a having a periodic structure whose direction is a first direction OA1, and an anisotropic medium 114b having a periodic structure whose direction is a second direction OA2 perpendicular to the first direction OA1. This makes it possible to implement a cell which advances the wavefront of X-polarized light relative to that of Y-polarized light, and a cell which retards the wavefront of X-polarized light relative to that of Y-polarized light. The anisotropic media 114a and 114b can also be interpreted as anisotropic media having their optic axes in the first direction OA1 and the second direction OA2, respectively.

Japanese Patent Laid-Open No. 2006-196715, for example, discloses a periodic structure which generates form birefringence as a diffraction grating made of quartz. Japanese Patent Laid-Open No. 2006-196715 describes an exemplary periodic structure which is made of quartz having a refractive index of 1.56 with respect to a wavelength of 193 nm, and has a duty ratio (filling factor) of the form birefringence region of 1:1 (=0.5). This periodic structure has a refractive index $n_\perp$ of 1.19 in its periodic direction, and a refractive index $n_{//}$ of 1.31 in a direction perpendicular to its periodic direction.

To independently give two phases to each of the wavefronts of X-polarized light and Y-polarized light, as described above, the plurality of cells 110a to 110d include isotropic media 112 having different thicknesses, and an anisotropic medium 114 having the same thickness, as shown in FIG. 2. More specifically, the plurality of cells 110 include cells 110b to 110d (first cells) including both isotropic media 112 and anisotropic media 114, and a cell 110a (second cell) including an anisotropic medium 114 alone.

Although the computer generated hologram 100 includes a plurality of four types of cells 110 in order to form a phase distribution including two phases in this embodiment, it must further include a plurality of other types of cells (cell structures) when it forms a phase distribution including N phases. However, even when a phase distribution including N phases is to be formed, anisotropic media 114 having the same thickness are used in at least four types of cells so as to independently give two of N phases to each of the wavefronts of X-polarized light and Y-polarized light.

The reason why anisotropic media 114 having the same thickness are used in at least four types of cells, and the cells 110 (cell structures) of the computer generated hologram 100 shown in FIG. 2 will be explained herein.

FIGS. 3A to 3C are conceptual views each showing the relationship between the phases of X-polarized light and Y-polarized light. In FIGS. 3A to 3C, the incident light is assumed to travel in the −Z direction.

FIG. 3A is a view concerning the incident light, in which reference symbols X0 and Y0 denote electric field vectors to define (determine) the phases of X-polarized light and Y-polarized light, respectively. Referring to FIG. 3A, the vector X0 points in the −X direction. The X-polarized light component retards relative to the Y-polarized light component. The Z-coordinates of the vectors X0 and Y0 indicate the positions of the wavefronts of the X- and Y-polarized light components.

FIG. 3B shows electric field vectors to define the phase of a phase distribution formed by the computer generated hologram 100. In FIG. 3B, vectors X0' and Y0' correspond to the vectors X0 and Y0, respectively, and reference symbol Y1 denotes an electric field vector to define the phase shifted by the computer generated hologram 100.

FIG. 3C shows electric field vectors to define the phase of a phase distribution formed by the computer generated hologram 100. In FIG. 3C, vectors X0" and Y0" correspond to the vectors X0 and Y0, respectively, and reference symbol X1 denotes an electric field vector to define the phase shifted by the computer generated hologram 100.

When the computer generated hologram 100 is assumed to be that which forms a phase distribution including two phases, two phase differences between X-polarized light and Y-polarized light are necessary. FIGS. 3B and 3C show wavefront shifts which correspond to two phase differences and are 0 and 2L, respectively. A computer generated hologram which forms a phase distribution including two phases typically uses phase differences of 0 and $\pi(\lambda/2)$. When the phase differences corresponding to wavefront shifts of 0 and 2L are assumed to be 0 and $\pi(\lambda/2)$, a wavefront shift L corresponds to a phase difference of $\pi/2(\lambda/4)$. Therefore, the establishment of both phase relationships as shown in FIGS. 3B and 3C requires an anisotropic medium which gives a phase difference of $\pi/2(\lambda/4)$ between the wavefronts of X-polarized light and Y-polarized light.

The phase conversion shown in FIG. 3B exemplifies the function of the cell 110a shown in FIG. 2, and is assumed as a reference. Although the phase conversion shown in FIG. 3B in reality exhibits an effect of retarding the phase of Y-polarized light by $\pi/2$ relative to the incident light without changing the phase of X-polarized light relative to the incident light, it is assumed to be (0, 0) because a combination of these phases is assumed as a reference. Under this assumption, the phase conversion shown in FIG. 3C is $(-\pi/2, \pi/2)$ assuming the phase conversion shown in FIG. 3B as a reference. When the computer generated hologram 100 is assumed to be that which forms a phase distribution including two phases, the phases required for each phase conversion must be 0 and $\pi$. To meet this need, an isotropic medium which retards the phases of both X-polarized light and Y-polarized light by $\pi/2$ is adopted to change the phase conversion shown in FIG. 3C to $(-\pi, 0)$. The phase conversion shown in FIG. 3C exemplifies the function of the cell 110c shown in FIG. 2.

A computer generated hologram which forms a phase distribution including two phases requires phase conversions of $(-\pi, -\pi)$ and $(0, -\pi)$, in addition to phase conversions of $(0, 0)$ and $(-\pi, 0)$. When an isotropic medium which retards the phases of both X-polarized light and Y-polarized light by π is added to the cell 110a shown in FIG. 2, phase conversion of (−π, −π) is obtained and it exemplifies the function of the cell 110b shown in FIG. 2. When an isotropic medium which retards the phases of both X-polarized light and Y-polarized light by π is added to the cell 110c shown in FIG. 2, phase conversion of (−2π, −π) is obtained and it exemplifies the function of the cell 110d shown in FIG. 2. Since the phase is a periodic function with a period of 2π, phase conversion of (−2π, −π) plays the same role as phase conversion of (0, −π).

In this manner, the cells 110a, 110b, 110c, and 110d shown in FIG. 2 correspond to phase conversions of (0, 0), (−π, −π), (−π, 0), and (0, −π), respectively. Because the cells 110a to 110d have the functions shown in FIGS. 3A to 3C, which require an anisotropic medium for giving a phase difference of π/2 between the wavefronts of X-polarized light and Y-polarized light, anisotropic media 114 having the same thickness are used in at least four types of cells.

If the computer generated hologram 100 is embodied as that which forms a phase distribution including two phases, the phase signs indicating the phase advance and retardation can be selected arbitrarily and therefore need not be taken into consideration. In contrast, if the computer generated hologram 100 is embodied as that which forms a phase distribution including more than two phases, the phase signs need to be taken into consideration, and the foregoing explanation thereof has been given for this reason.

A thickness $h_0$ of the anisotropic media 114 and thicknesses $h_1$ to $h_3$ of the isotropic media 112 in the cells 110a to 110d will be explained in detail next.

The anisotropic media 114 must have a thickness $h_0$ that is sufficient to give a phase difference of π/2(λ/4) between the wavefronts of X-polarized light and Y-polarized light, as described above. To achieve this, the anisotropic media 114 need only have a thickness $h_0$ given by:

$$h_0 = \frac{1}{4}\frac{\lambda}{n_{II} - n_\perp} \quad (2)$$

where $n_\perp$ is the refractive index of the periodic structure of the anisotropic medium 114 in its periodic direction, and $n_{II}$ is the refractive index of the periodic structure of the anisotropic medium 114 in a direction perpendicular to its periodic direction.

To implement a function of retarding the phases of the wavefronts of both X-polarized light and Y-polarized light by π/2(λ/4), the isotropic medium 112 of the cell 110c need only have a thickness $h_1$ given by:

$$h_1 = \frac{1}{4}\frac{\lambda}{n - 1} \quad (3)$$

where n is the refractive index of the isotropic medium 112 of the cell 110c.

To implement a function of retarding the phases of the wavefronts of both X-polarized light and Y-polarized light by π(λ/2), the isotropic medium 112 of the cell 110b need only have a thickness $h_2$ twice the thickness $h_1$ of the isotropic medium 112 of the cell 110c.

Likewise, to implement a function of retarding the phases of the wavefronts of both X-polarized light and Y-polarized light by 3π/2(3λ/4), the isotropic medium 112 of the cell 110d need only have a thickness $h_3$ three times the thickness $h_1$ of the isotropic medium 112 of the cell 110c.

The thickness of the computer generated hologram 100 (i.e., the overall thickness of the cell structures) shown in FIG. 2 will be considered. The cell 110d has a largest thickness of $h_0 + 3h_1$ ($h_0 + h_3$) in the computer generated hologram 100. In one concrete example, the thickness $h_3$ of the cell 110d is 402+3×86=660 [nm] for a wavelength=193 nm and a refractive index=1.56. In contrast, to give a phase difference of π between the wavefronts of X-polarized light and Y-polarized light by the periodic structure of the anisotropic medium alone, it must have a thickness of $2h_0$=804 [nm]. Hence, a computer generated hologram thinner than a λ/2 plate can be obtained by giving an appropriate phase difference between X-polarized light and Y-polarized light of the incident light.

A computer generated hologram which forms a phase distribution including two phases has been explained above. Note that a phase distribution including two phases means herein only a phase distribution formed (generated) by a designed computer generated hologram. Accordingly, the phases of the phase distribution need not include those generated upon a phase shift attributed to manufacturing errors of the computer generated hologram or when the period (pitch) of the periodic structure (unevenness shape) of the anisotropic medium is inaccurate, i.e., a phase shift of less than a phase difference corresponding to one step formed by the computer generated hologram. In other words, even when a phase distribution formed by the computer generated hologram has a phase shift of less than one step between certain phases, they are assumed to be in phase with each other.

The cell structures of the computer generated hologram 100 alone have been explained in this embodiment. In fact, the periodic structure which generates form birefringence is floating in the air, as shown in FIG. 2, and this state is hard to maintain. To overcome this difficulty, the cells 110a to 110d are arranged on a substrate made of, for example, quartz in practice. For the sake of easy understanding of the configuration of the cells 110a to 110d, FIG. 2 shows anisotropic media (periodic structures which generate form birefringences) and isotropic media which are arranged on the upper and lower sides, respectively. However, the anisotropic and isotropic media may be arranged in reverse order, and an arrangement suited to a method of manufacturing a computer generated hologram used can be selected.

An example of a method of manufacturing a computer generated hologram 100 will be explained next. This manufacturing method is a method of manufacturing a computer generated hologram 100 including cells with different thicknesses set, i.e., a periodic structure (unevenness shape) configured to generate form birefringence.

First, a substrate of a computer generated hologram 100 is coated with a photosensitive resin (photoresist) using a coating apparatus.

Next, the pattern of a predetermined computer generated hologram is transferred onto the photoresist using an exposure apparatus. After that, the photoresist is developed using a development apparatus to form a periodic structure (unevenness pattern) on the photoresist.

Dry etching is then performed for the substrate using a reactive ion etching apparatus and the unevenness pattern formed on the photoresist as an etching mask to form a groove having a predetermined depth in the substrate. The photoresist is finally removed by asking using a solvent or a gas.

A computer generated hologram 100 as described above can be manufactured by these processes. Note that the method of manufacturing a computer generated hologram 100 explained in this embodiment is merely an example, and other microfabrication techniques such as nanoimprint may be used as long as a computer generated hologram 100 (a periodic structure which generates form birefringence) as described above can be manufactured.

Detailed design examples of a computer generated hologram 100 and an exposure apparatus to which the computer generated hologram 100 is applied will be explained below.

First Embodiment

A design example of a computer generated hologram which forms a phase distribution including two phases assuming an annular light intensity distribution formed by S-polarized light as a target image will be explained in the first embodiment. More specifically, a case in which a computer generated hologram 100 forms an annular light intensity distribution (target image) LI as shown in FIG. 4 will be explained. FIG. 4 is a view showing an example of an annular light intensity distribution (target image) LI formed by the computer generated hologram 100.

Polarization directions PD in the light intensity distribution LI shown in FIG. 4 include a plurality of polarization directions $PD_1$ to $PD_4$, and are parallel to the circumferential direction of concentric circles (i.e., correspond to S-polarization). How to design a computer generated hologram 100 which forms a light intensity distribution LI as shown in FIG. 4 will be explained using cells 110a to 110d shown in FIG. 2.

First, the light intensity distribution LI shown in FIG. 4 is divided into X- and Y-polarized light components in accordance with their intensity ratio, as shown in FIGS. 5A and 5B. FIGS. 5A and 5B are charts showing the intensities of X- and Y-polarized light components when the light intensity distribution LI shown in FIG. 4 is divided into them in accordance with their intensity ratio. As in the light intensity distribution LI shown in FIG. 4, if the target image includes polarization directions other than the polarization directions of X-polarized light and Y-polarized light, e.g., it includes polarization directions $PD_3$ and $PD_4$, it is necessary to take account of not only the intensity (i.e., the amplitude) of the target image but also the phase of the target image.

The phases of the divided X- and Y-polarized light components are determined in accordance with the polarization directions PD. In the first embodiment, since a state in which X-polarized light is in phase with Y-polarized light on a predetermined plane PS is assumed as a reference, the X-polarized light must be in phase with the Y-polarized light in a polarization direction (for example, the polarization direction $PD_4$) including the +X and +Y directions. For the same reason, the X-polarized light must be π out of phase with the Y polarized light in a polarization direction (for example, the polarization direction $PD_3$) including the +X and −Y directions.

FIGS. 6A and 6B are charts showing the phases of X- and Y-polarized light components (FIGS. 5A and 5B, respectively) when the light intensity distribution LI shown in FIG. 4 is divided into them in accordance with their intensity ratio. Note that FIGS. 6A and 6B show an example of a combination of the phases of the X- and Y-polarized light components in each region (pixel) on the predetermined plane PS.

A computer generated hologram corresponding to the intensities and phases of the X- and Y-polarized light components is designed. FIG. 7A is a chart showing the phase distribution of a computer generated hologram designed by DBS (Direct Binary Search) to be compatible with the intensity and phase of the X-polarized light component shown in FIGS. 5A and 6A, respectively. FIG. 7B is a chart showing the phase distribution of a computer generated hologram designed by DBS to be compatible with the intensity and phase of the Y-polarized light component shown in FIGS. 5B and 6B, respectively.

The two computer generated holograms designed to be compatible with the X- and Y-polarized light components (the computer generated holograms shown in FIGS. 7A and 7B) are integrated.

FIG. 8 is a chart showing the thickness of each cell of the computer generated hologram 100 obtained by integrating the computer generated holograms shown in FIGS. 7A and 7B by selecting the cells 110a to 110d shown in FIG. 2. In FIG. 8, the density represents the thickness of each cell (in the Z direction). A color closer to white indicates a larger thickness, and that closer to black indicates a smaller thickness. The numeric values shown in FIG. 8 indicate the thicknesses of the respective cells of the computer generated hologram 100 (unit: μm). Note that the numeric values shown in FIG. 8 illustrate an example when an anisotropic medium 114 (periodic structure) is made of quartz having a refractive index of 1.56 with respect to a wavelength of 193 nm.

When right-handed circularly polarized light in which X-polarized light retards by π/2 relative to Y-polarized light impinges on the computer generated hologram 100 shown in FIG. 8, this hologram forms a phase distribution including two phases to form a light intensity distribution LI as shown in FIG. 4 (an annular light intensity distribution formed by S-polarized light) as a reproduced image.

Because the prior arts require sub CGHs of types in a number equal to that of polarization directions of the target image, it is difficult for them to continuously change the polarization direction in each pixel. In contrast, the first embodiment can set a computer generated hologram capable of continuously changing the polarization direction in each pixel, as described above.

Also in the first embodiment, a computer generated hologram thinner than a λ/2 plate, more specifically, a computer generated hologram with a thickness 660/804=0.82 times that of a λ/2 plate can be manufactured by giving an appropriate phase difference between X-polarized light and Y-polarized light of the incident light.

In this manner, the first embodiment can provide a computer generated hologram which suppresses an illuminance variation and a loss in light amount and achieve a structure thinner than ever, thus forming a light intensity distribution (reproduced image) with a desired shape and polarization state.

Second Embodiment

A design example of a computer generated hologram which forms a phase distribution including four phases assuming an annular light intensity distribution formed by S-polarized light as a target image will be explained in the second embodiment. More specifically, a case in which a computer generated hologram 100 forms an annular light intensity distribution (target image) LI as shown in FIG. 4 will be explained, as in the first embodiment.

FIG. 9A is a chart showing the phase distribution of a computer generated hologram designed by DBS to be compatible with the intensity and phase of the X-polarized light component shown in FIGS. 5A and 6A, respectively. FIG. 9B is a chart showing the phase distribution of a computer generated hologram designed by DBS to be compatible with the intensity and phase of the Y-polarized light component shown in FIGS. 5B and 6B, respectively. The phase distributions of the computer generated hologram shown in FIGS. 7A and 7B are represented by two colors, whereas those shown in FIGS.

9A and 9B are represented by four colors as the number of phases included in the phase distribution has changed from two to four.

The phase difference between X-polarized light and Y-polarized light is controlled by changing the thickness of an anisotropic medium 114 in the above-described embodiments. However, it is also possible to control the phase difference between X-polarized light and Y-polarized light by changing the refractive indices of the anisotropic medium 114 with respect to X-polarized light and Y-polarized light. The refractive indices can be controlled by changing the filling factor (duty ratio) of the periodic structure of the anisotropic medium 114.

More specifically, if the filling factor of the periodic structure of the anisotropic medium 114 is 0.5, a refractive index $n_\perp^{0.50}$ of the periodic structure in its periodic direction is 1.19, and a refractive index $n_{II}^{0.50}$ of the periodic structure in a direction perpendicular to its periodic direction is 1.31. In addition, if the filling factor of the periodic structure of the anisotropic medium 114 is 0.93, a refractive index $n_\perp^{0.93}$ of the periodic structure in its periodic direction is 1.49, and a refractive index $n_{II}^{0.93}$ of the periodic structure in a direction perpendicular to its periodic direction is 1.53. According to this fact, if the filling factor of the periodic structure of the anisotropic medium 114 is 0.5, the difference in refractive index between the periodic direction of the periodic structure and a direction perpendicular to the periodic direction is 0.12. In addition, if the filling factor of the periodic structure of the anisotropic medium 114 is 0.93, the difference in refractive index between the periodic direction of the periodic structure and a direction perpendicular to the periodic direction is 0.04. In this manner, the differences in refractive index between the periodic direction of the periodic structure and a direction perpendicular to the periodic direction when the filling factor of the periodic structure of the anisotropic medium 114 is 0.5 and 0.93 have a relation of 3:1. Note that the periodic structure of the anisotropic medium 114 is made of quartz having a refractive index of 1.56 with respect to a wavelength of 193 nm.

Since a computer generated hologram which forms a phase distribution including four phases must give four phases to each of X-polarized light and Y-polarized light, 4×4=16 types of cell structures are necessary. The 16 types of cell structures which constitute the computer generated hologram 100 will be explained with reference to FIG. 10. FIG. 10 is a schematic perspective view showing cell structures of four of 16 types, which constitute the computer generated hologram 100.

Cells 110a1 to 110d1 shown in FIG. 10 exemplify four types of cell structures. Anisotropic media 114 of the cells 110a1 and 110c1 have periodic structures (unevenness shapes) with a filling factor of 0.93. Also, anisotropic media 114 of the cells 110b1 and 110d1 have periodic structures (unevenness shapes) with a filling factor of 0.50.

The anisotropic media 114 of the cells 110a1 to 110d1 have the same thickness $h_0'$. Then, a phase difference between X-polarized light and Y-polarized light formed by the cells 110b1 and 110d1 is three times that formed by the cells 110a1 and 110c1 from the above-mentioned relation of 3:1. Note that a periodic direction OA1' of the periodic structures of the anisotropic media 114 of the cells 110a1 and 110b1, and a periodic direction OA2' of the periodic structures of the anisotropic media 114 of the cells 110c1 and 110d1 are orthogonal to each other.

The thickness $h_0'$ of the anisotropic media 114 is that of a phase plate which forms a phase difference of $3\pi/4 (3\lambda/8)$, and is generally that of a phase plate which forms a phase difference of $(N-1)\pi/N ((N-1)\lambda/2N)$. By generalizing equation (2), the thickness $h_0'$ of the anisotropic media 114 is given by:

$$h_0' = \frac{1}{2} \frac{N-1}{N} \frac{\lambda}{n_{II} - n_\perp} \quad (4)$$

To put it another way, letting λ be the wavelength of the incident light, and Δna be the difference between the refractive indices of the anisotropic media 114 with respect to X- and Y-polarized light components, the thickness $h_0'$ of the anisotropic media 114 is equal to or less than λ/Δna×(N−1)/2N.

In one concrete example, the thickness $h_0'$ of the anisotropic media 114 is 603 [nm] for a wavelength=193 nm and a refractive index=1.56. This means that anisotropic media 114 of a plurality of cells 110 (a computer generated hologram 100) which form a phase distribution including two or more phases have a thickness equal to or less than $h_0'$.

When the filling factors of the periodic structures of the anisotropic media 114 are set by taking account of the phase differences alone, phases formed by the cells 110a1 and 110b1, for example, do not match each other in either X-polarized light or Y-polarized light. It is therefore necessary to match the phases of X-polarized light or Y-polarized light in the cells 110a1 to 110d1 which constitute the computer generated hologram 100. A case in which the phases of X-polarized light are matched will be explained herein.

To match the phases of X-polarized light, it is only necessary to cancel wavefront shifts attributed to the difference between the refractive indices $n_\perp^{0.50}$ and $n_\perp^{0.93}$ of the periodic structures in the X-polarization direction, i.e., in the periodic direction of the periodic structures. It is, in turn, only necessary to add isotropic media 112 to cells having a relatively low refractive index, i.e., cells 110b1 and 110d1 in which the periodic structures of the anisotropic media 114 have a filling factor of 0.5. The isotropic media 112 of the cells 110b1 and 110d1 have a thickness $h_1'$ given by:

$$h_1' = \frac{n_\perp^{0.93} - n_\perp^{0.50}}{n - 1} h_0' \quad (5)$$

In one concrete example, the thickness $h_1'$ of the isotropic media 112 is 323 [nm] for a wavelength=193 nm and a refractive index=1.56.

FIG. 11 is a table showing 16 types of cell constituent elements which constitute a computer generated hologram for forming a phase distribution including four phases. Referring to FIG. 11, the first row of each box shows phase conversion of X-polarized light and Y-polarized light, and the second row of each box shows the filling factor of the anisotropic medium 114 of each cell (i.e., the selected one of the cells 110a1 to 110d1 shown in FIG. 10). "Vertical: 0.93", "Vertical: 0.50", "Horizontal: 0.93", and "Horizontal: 0.50" correspond to the cells 110a1 to 110d1, respectively. The third row of each box shows the amount by which the isotropic medium 112 retards the phases of both X-polarized light and Y-polarized light. By generalizing equation (3), thicknesses $H_i$ of the isotropic media 112 required to retard the phases by $i\pi/4 (i\lambda/8)$ for i=0, 1, 2, 2, ..., N−1 are given by:

$$H_i = \frac{i}{2N}\frac{\lambda}{n-1} \quad (6)$$

To put it another way, letting Δnb be the difference between the refractive index of the isotropic media 112 with respect to the incident light and that of the atmosphere, and i be an integer within the range of 1 (inclusive) to 2N−1 (inclusive), the thicknesses $H_i$ of the isotropic medium 112 are given by λ/Δnb×i/2N.

In one concrete example, the thicknesses $H_i$ of the isotropic media 112 are $H_o$=0 [nm], $H_1$=43 [nm], $H_2$=86 [nm], . . . for a wavelength=193 nm and a refractive index=1.56. This means that the isotropic media 112 have 2N−1 thicknesses equal to $H_i$ (i is an integer within the range of 1 (inclusive) to 2N−1 (inclusive)).

FIG. 12 is a chart showing the thickness of each cell of a computer generated hologram 100 obtained by integrating the computer generated holograms shown in FIGS. 9A and 9B in accordance with the cell constituent elements shown in FIG. 11. The numeric values shown in FIG. 12 indicate the thicknesses of the respective cells of the computer generated hologram 100 (unit: μm). Note that the numeric values shown in FIG. 12 illustrate an example when the anisotropic medium 114 (periodic structure) is made of quartz having a refractive index of 1.56 with respect to a wavelength of 193 nm.

When right-handed elliptically polarized light in which X-polarized light retards by 2π×1/2N, i.e., π/4(λ/8) relative to Y-polarized light impinges on the computer generated hologram 100 shown in FIG. 12, this hologram forms a phase distribution including four phases to form a light intensity distribution LI as shown in FIG. 4 as a reproduced image. This means that the incident light includes X- and Y-polarized light components, which are n/N out of phase with each other.

In the second embodiment, the anisotropic media 114 of the cells 110a1 to 110d1 can be made to have only one step (i.e., the anisotropic media 114 can be made to have the same thickness) by setting different filling factors for the periodic structures of the anisotropic media 114. This makes it possible to form a phase distribution designed by a computer generated hologram with fewer steps, thus reducing manufacturing errors.

In this manner, the second embodiment can provide a computer generated hologram which suppresses an illuminance variation and a loss in light amount and achieve a structure thinner than ever, thus forming a light intensity distribution (reproduced image) with a desired shape and polarization state.

According to the first and second embodiments, the computer generated hologram 100 includes a plurality of four or more types of cells including anisotropic media with a thickness $h_o'$ given by equation (4). Also, a cell of one of these four types includes an anisotropic medium alone, and cells of the other three types include isotropic media with thicknesses $H_i$ (i is an integer of 1, 2, and 3) given by equation (6).

Although a case in which a computer generated hologram including few cells has been exemplified in the first and second embodiments, it is also possible to form a light intensity distribution with a desired shape and polarization state by increasing the number of cells of the computer generated hologram. Increasing the number of cells of the computer generated hologram reduces the size at which the light intensity distribution (target image) is divided into pixels. This makes it possible to form a uniform light intensity distribution (target image).

In the first and second embodiments, the target image includes polarization directions (for example, the polarization directions $PD_3$ and $PD_4$) other than the polarization directions of X-polarized light and Y-polarized light. Therefore, the phase difference between X-polarized light and Y-polarized light of the incident light is limited because of importance of the relative positional relationship between X-polarized light and Y-polarized light. However, if the target image includes the polarization directions of X-polarized light and Y-polarized light (for example, the polarization directions $PD_1$ and $PD_2$) alone, it is possible to arbitrarily set (select) the phase difference between X-polarized light and Y-polarized light as long as the X-polarized light and Y-polarized light of the incident light have the same amplitude. For this reason, the incident light may be either linearly polarized light or non-polarized light.

A computer generated hologram which forms a phase distribution including two or four phases has been explained in the first and second embodiments. However, a computer generated hologram which forms a phase distribution including phases in a number (for example, three, eight, or 16) other than two and four can be formed in the same way, as a matter of course.

In the first and second embodiments, the periodic structure (unevenness shape) of the anisotropic medium means a structure in which media and air are alternately juxtaposed with a period (pitch) equal to or less than the wavelength of the incident light. Even when a structure obtained by substituting another medium for air and alternately juxtaposing two different media with a period equal to or less than the wavelength of the incident light is used, it is possible to implement the same function as that of the above-mentioned periodic structure by changing the thicknesses of elements. Hence, the periodic structure of the anisotropic medium is not limited to that including media and air, and may include two different media.

As can be understood from the above description, a plurality of cells which constitute a computer generated hologram include four types of cells (1) to (4):

(1): a cell including an anisotropic medium with a thickness of λ/Δna×(N−1)/2N (2): a cell including an anisotropic medium with a thickness of λ/Δna×(N−1)/2N, and an isotropic medium with a thickness of λ/Δnb×1/2N (3): a cell including an anisotropic medium with a thickness of λ/Δna×(N−1)/2N, and an isotropic medium with a thickness of λ/Δnb×2/2N (4): a cell including an anisotropic medium with a thickness of λ/Δna×(N−1)/2N, and an isotropic medium with a thickness of λ/Δnb×3/2N Note that λ is the wavelength of the incident light, Δna is the difference between the refractive indices of the anisotropic media with respect to X- and Y-polarized light components, Δnb is the difference between the refractive index of the isotropic media with respect to the incident light and that of the atmosphere, and i is an integer within the range of 1 (inclusive) to 2N−1 (inclusive).

Third Embodiment

Figure 13:
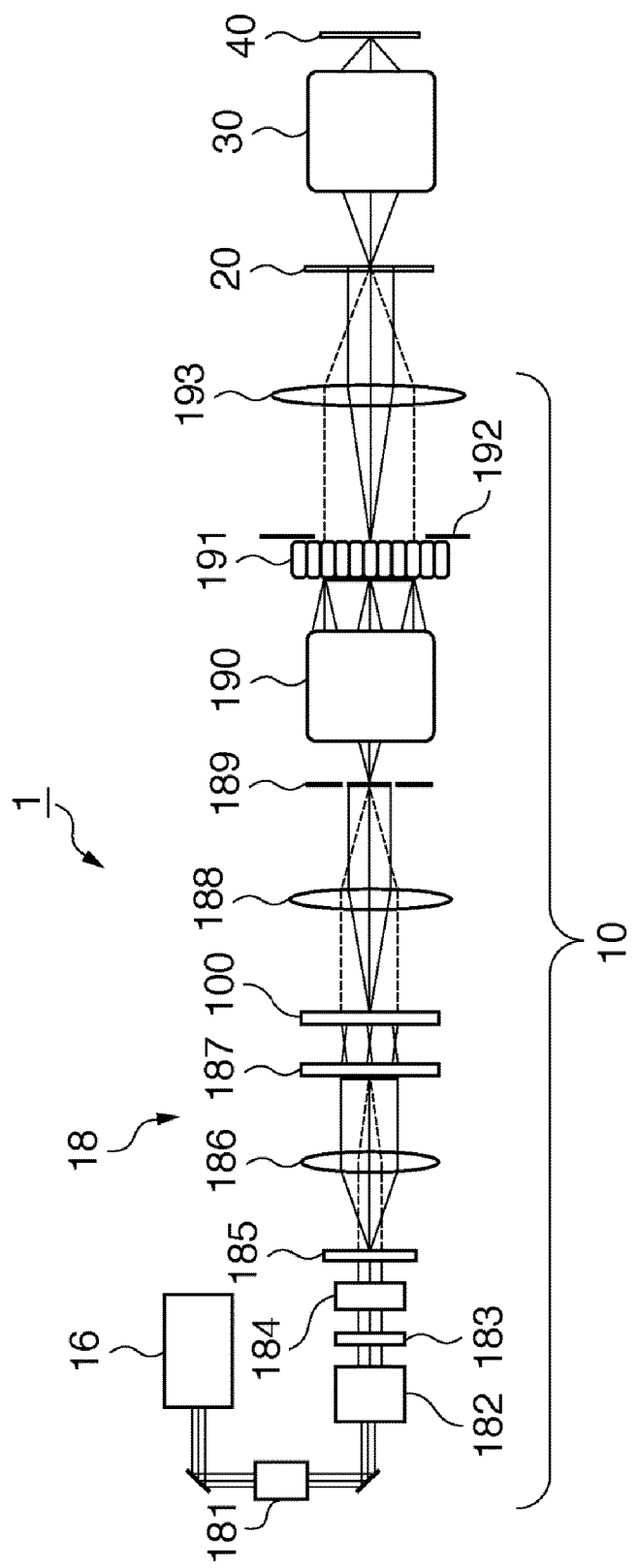
FIG. 13 is a view showing the arrangement of an exposure apparatus according to one aspect of the present invention.

In the third embodiment, an exposure apparatus 1 to which the computer generated hologram 100 according to the present invention is applied will be explained below with reference to FIG. 13. FIG. 13 is a view showing the arrangement of the exposure apparatus 1 according to one aspect of the present invention.

In this embodiment, the exposure apparatus 1 is a projection exposure apparatus which transfers the pattern of a reticle 20 onto a wafer 40 by the step & scan scheme. However, the exposure apparatus 1 can adopt the step & repeat scheme or another exposure scheme.

As shown in FIG. 13, the exposure apparatus 1 includes an illumination apparatus 10, a reticle stage (not shown) for supporting the reticle 20, a projection optical system 30, and a wafer stage (not shown) for supporting the wafer 40.

The illumination apparatus 10 illuminates the reticle 20 on which a circuit pattern to be transferred is formed, and includes a light source 16 and illumination optical system 18.

The light source 16 is, for example, an excimer laser such as an ArF excimer laser with a wavelength of about 193 nm or a KrF excimer laser with a wavelength of about 248 nm. However, the light source 16 is not particularly limited to an excimer laser, and may be, e.g., an $F_2$ laser with a wavelength of about 157 nm or a mercury lamp with a narrow wavelength range.

The illumination optical system 18 illuminates the reticle 20 with light from the light source 16, and performs modified illumination on the reticle 20 in a predetermined polarization state while ensuring a predetermined illuminance in this embodiment. The illumination optical system 18 includes a light extension optical system 181, beam shaping optical system 182, polarization controller 183, phase controller 184, exit angle saving optical element 185, relay optical system 186, multibeam generation unit 187, and computer generated hologram 100. The illumination optical system 18 also includes a relay optical system 188, aperture 189, zoom optical system 190, multibeam generation unit 191, aperture stop 192, and irradiation unit 193.

The light extension optical system 181 deflects light from the light source 16 to guide it to the beam shaping optical system 182. The beam shaping optical system 182 shapes the section of the light from the light source 16 into a desired shape by converting the horizontal to vertical ratio of the section of the light from the light source 16 into a desired value (e.g., by changing the sectional shape from a rectangle to a square). The beam shaping optical system 182 forms a light beam with a size and an angle of divergence which are required to illuminate the multibeam generation unit 187.

The polarization controller 183 includes, e.g., a linear polarizer and has a function of removing unnecessary polarized light components. It is possible to efficiently convert light from the light source 16 into desired linearly polarized light by minimizing polarized light components removed (shielded) by the polarization controller 183.

The phase controller 184 converts the light linearly polarized by the polarization controller 183 to light (incident light) suited to the computer generated hologram 100. The phase controller 184, for example, converts that light to circularly polarized light by giving a phase difference of λ/4 to it, converts that light to elliptically polarized light by giving a phase difference less than λ/4 to it, or keeps that light linearly polarized without giving a phase difference.

The exit angle saving optical element 185 includes, e.g., an optical integrator (e.g., a fly-eye lens or fiber bundle including a plurality of microlenses), and outputs the light at a predetermined angle of divergence.

The relay optical system 186 converges the light which emerges from the exit angle saving optical element 185 on the multibeam generation unit 187. The relay optical system 186 adjusts the exit surface of the exit angle saving optical element 185 and the incident surface of the multibeam generation unit 187 to hold the Fourier transform relationship (the relationship between the object plane and the pupil plane or that between the pupil plane and the image plane).

The multibeam generation unit 187 includes an optical integrator (e.g., a fly-eye lens or fiber bundle including a plurality of microlenses) for uniformly illuminating the computer generated hologram 100. The exit surface of the multibeam generation unit 187 forms a light source surface including a plurality of point light sources. The light which emerges from the multibeam generation unit 187 impinges on the computer generated hologram 100.

The computer generated hologram 100 forms a predetermined light intensity distribution (e.g., a light intensity distribution IL as shown in FIG. 4) at the position of the aperture 189 via the relay optical system 188. The computer generated hologram 100 can take any of the above-described forms, and a detailed description thereof will not be given herein.

The aperture 189 has a function of passing only a light intensity distribution formed by the computer generated hologram 100. The computer generated hologram 100 and aperture 189 are set to hold the Fourier transform relationship.

The zoom optical system 190 enlarges a light intensity distribution formed by the computer generated hologram 100 at a predetermined magnification, and projects it onto the multibeam generation unit 191.

The multibeam generation unit 191 is inserted on the pupil plane of the illumination optical system 18, and forms, on its exit surface, a light source image (effective light source distribution) corresponding to the light intensity distribution formed at the position of the aperture 189. In this embodiment, the multibeam generation unit 191 includes an optical integrator such as a fly-eye lens or cylindrical lens array. The aperture stop 192 is inserted near the exit surface of the multibeam generation unit 191.

The irradiation unit 193 includes, e.g., a condenser optical system and illuminates the reticle 20 with an effective light source distribution formed on the exit surface of the multibeam generation unit 191.

The reticle 20 has a circuit pattern and is supported and driven by the reticle stage (not shown). Diffracted light generated by the reticle 20 is projected onto the wafer 40 via the projection optical system 30. Since the exposure apparatus 1 is of the step & scan scheme, it transfers the pattern of the reticle 20 onto the wafer 40 by scanning them.

The projection optical system 30 projects the pattern of the reticle 20 onto the wafer 40. The projection optical system 30 can be a dioptric system, catadioptric system, or catoptric system.

The wafer 40 is a substrate onto which the pattern of the reticle 20 is projected (transferred), and is supported and driven by the wafer stage (not shown). However, it is also possible to use a glass plate or another substrate in place of the wafer 40. The wafer 40 is coated with a photoresist.

The computer generated hologram 100 does not give a phase distribution to the wavefront of light polarized in a single direction, but two-dimensionally gives different phase distributions to the wavefronts of both X-polarized light and Y-polarized light. This makes it possible to form a light intensity distribution almost without generating any loss in light amount.

In exposure, light emitted by the light source 16 illuminates the reticle 20 by the illumination optical system 18. The light which bears the information of the pattern of the reticle 20 forms an image on the wafer 40 by the projection optical system 30. The illumination optical system 18 used for the exposure apparatus 1 can suppress any illumination variation and loss in light amount, and form a light intensity distribution with a desired shape and polarization state by the computer generated hologram 100. Hence, the exposure apparatus 1 can provide high-quality devices (e.g., a semiconductor device, an LCD device, an image sensing device (e.g., a CCD), and a thin-film magnetic head) with a high throughput and a good economical efficiency. These devices are fabricated by a step of exposing a substrate (e.g., a wafer or glass plate) coated with a photoresist (photosensitive agent) using the exposure apparatus 1, a step of developing the exposed substrate, and other known steps.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent application No. 2008-152259 filed on Jun. 10, 2008, which is hereby incorporated by reference herein in its entirety.

What is claimed is:

1. A hologram including a plurality of cells which form a light intensity distribution on a predetermined plane,
the plurality of cells including
a plurality of first cells including isotropic media and anisotropic media, and
a plurality of second cells including anisotropic media alone,
wherein the plurality of cells change a phase of incident light which impinges on each of the plurality of cells to form a phase distribution including N phases (N is the number of phases, $N \geq 2$) for each of a wavefront of a linearly polarized light component in a first direction and a wavefront of a linearly polarized light component in a second direction perpendicular to the first direction,
each of said anisotropic media of said plurality of first cells and said plurality of second cells includes one of an anisotropic medium having an optic axis in the first direction and an anisotropic medium having an optic axis in the second direction, and
letting $\lambda$ be a wavelength of the incident light, and $\Delta na$ be a difference between refractive indices, with respect to linearly polarized light components in the first direction and the second direction, of each of said anisotropic media of said plurality of first cells and said plurality of second cells, an anisotropic medium thickest of said anisotropic media of said plurality of first cells and said plurality of second cells has a thickness of $\lambda/\Delta na \times (N-1)/2N$.

2. The hologram according to claim 1, wherein
the incident light includes linearly polarized light components in the first direction and the second direction, and
a phase difference between the linearly polarized light components in the first direction and the second direction is $\pi/N$.

3. The hologram according to claim 1, wherein letting $\Delta nb$ be a difference between a refractive index of each of said isotropic media of said plurality of first cells with respect to the incident light and a refractive index of an atmosphere, and i be an integer within a range of 1 (inclusive) to 2N−1 (inclusive), said isotropic media of said plurality of first cells have 2N−1 thicknesses given by $\lambda/\Delta nb \times i/2N$.

4. The hologram according to claim 1, wherein
each of said anisotropic media of said plurality of first cells and said plurality of second cells
has a one-dimensional periodic structure which has a period smaller than the wavelength of the incident light and generates form birefringence, and
includes one of an anisotropic medium having a periodic structure with a periodic direction in the first direction, and an anisotropic medium having a periodic structure with a periodic direction in the second direction.

5. The hologram according to claim 4, wherein each of said anisotropic media of said plurality of first cells and said plurality of second cells has a periodic structure with one filling factor selected from a plurality of different filling factors.

6. The hologram according to claim 1, wherein letting $\Delta nb$ be a difference between a refractive index of each of said isotropic media of said plurality of first cells with respect to the incident light and a refractive index of an atmosphere, the plurality of cells include
a cell including an anisotropic medium with a thickness of $\lambda/\Delta na \times (N-1)/2N$,
a cell including an anisotropic medium with a thickness of $\lambda/\Delta na \times (N-1)/2N$, and an isotropic medium with a thickness of $\lambda/\Delta nb \times 1/2N$,
a cell including an anisotropic medium with a thickness of $\lambda/\Delta na \times (N-1)/2N$, and an isotropic medium with a thickness of $\lambda/\Delta nb \times 2/2N$, and
a cell including an anisotropic medium with a thickness of $\lambda/\Delta na \times (N-1)/2N$, and an isotropic medium with a thickness of $\lambda/\Delta nb \times 3/2N$.

7. The hologram according to claim 1, wherein
the incident light includes circularly polarized light, and
the number of phases is N=2.

8. An exposure apparatus comprising:
an illumination optical system configured to illuminate a reticle with light from a light source; and
a projection optical system configured to project a pattern of the reticle onto a substrate,
wherein said illumination optical system includes a hologram according to claim 1.

9. The apparatus according to claim 8, wherein said illumination optical system is configured to provide circularly polarized light to said hologram.

10. A device fabrication method comprising steps of:
exposing a substrate using an exposure apparatus; and
performing a development process for the substrate exposed,
wherein said exposure apparatus includes:
an illumination optical system configured to illuminate a reticle with light from a light source; and
a projection optical system configured to project a pattern of the reticle onto the substrate,
wherein said illumination optical system includes a hologram including a plurality of cells which form a light intensity distribution on a predetermined plane,
the plurality of cells including
a plurality of first cells including isotropic media and anisotropic media, and
a plurality of second cells including anisotropic media alone,
wherein the plurality of cells change a phase of incident light which impinges on each of the plurality of cells to form a phase distribution including N phases (N is the number of phases, $N \geq 2$) for each of a wavefront of a linearly polarized light component in a first direction and a wavefront of a linearly polarized light component in a second direction perpendicular to the first direction,
each of said anisotropic media of said plurality of first cells and said plurality of second cells includes one of an anisotropic medium having an optic axis in the first direction and an anisotropic medium having an optic axis in the second direction, and letting λ be a wavelength of the incident light, and Δna be a difference between refractive indices, with respect to linearly polarized light components in the first direction and the second direction, of each of said anisotropic media of said plurality of first cells and said plurality of second cells, an anisotropic medium thickest of said anisotropic media of said plurality of first cells and said plurality of second cells has a thickness of $\lambda/\Delta na \times (N-1)/2N$.

* * * * *